United States Patent [19]

Watanabe et al.

[11] 4,055,817
[45] Oct. 25, 1977

[54] VARIABLE FREQUENCY OSCILLATOR

[75] Inventors: Yasuaki Watanabe; Yukio Okabe; Mitsuru Hayakawa; Yuichi Ikemura, all of Yokohama; Yasuhiro Fujita; Daisuke Murakami, both of Kadoma, all of Japan

[73] Assignees: Matsushita Electric Industrial Company Limited; Victor Company of Japan, Limited, both of Japan

[21] Appl. No.: 736,777

[22] Filed: Oct. 29, 1976

[30] Foreign Application Priority Data

Oct. 30, 1975 Japan ............... 50-130709

[51] Int. Cl.$^2$ ............ H03B 3/04; H03B 5/12
[52] U.S. Cl. ................. 331/117 R; 331/25; 331/34; 331/177 R
[58] Field of Search ........... 331/18, 25, 34, 36 R, 331/117 R, 177 R, 116 R; 325/419–423; 358/17, 23, 25, 195

[56] References Cited

U.S. PATENT DOCUMENTS

| 3,691,475 | 9/1972 | Mouri et al. | 331/34 X |
| 3,763,439 | 10/1973 | Peil | 331/34 X |
| 3,806,634 | 4/1974 | Abbott et al. | 331/177 R X |
| 3,973,221 | 8/1976 | Jett, Jr. | 331/34 X |

Primary Examiner—Siegfried H. Grimm
Attorney, Agent, or Firm—Robert E. Burns; Emmanuel J. Lobato; Bruce L. Adams

[57] ABSTRACT

A variable frequency oscillator comprises an oscillating loop and a variable phase shifter for imparting one of two different phase shifts depending upon the polarities of a DC control voltage to a signal from the oscillating loop. The phase-shifted signal has its amplitude controlled by the amplitude of the control voltage and is combined with the signal in the oscillating loop. The vector sum of the combined signals determines the phase angle of the oscillator signal and hence the frequency thereof.

9 Claims, 3 Drawing Figures

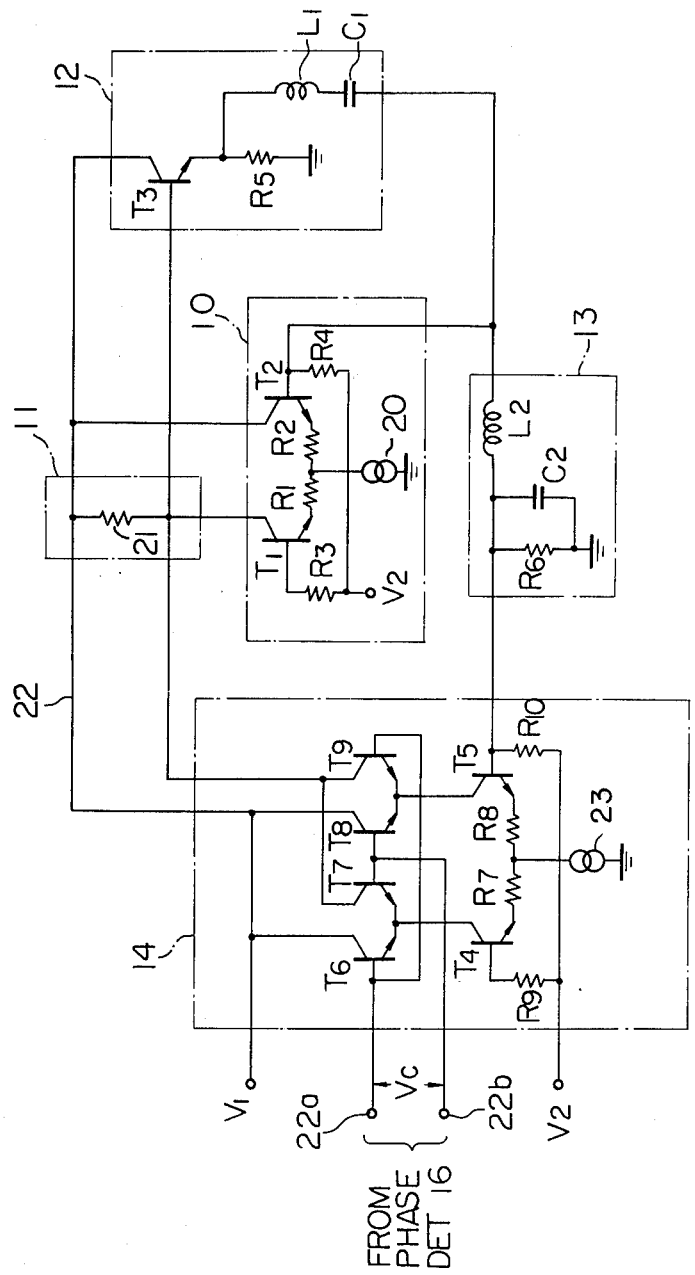

VARIABLE FREQUENCY OSCILLATOR

BACKGROUND OF THE INVENTION

The present invention relates generally to automatic frequency control circuits and in particular to a variable frequency oscillator which is free from disadvantages resulting from supply voltage fluctuations and nonuniform circuit parameters. The invention is particularly suitable for automatic phase control (APC) of color television receivers, and specifically suited for production in integral circuit configuration.

In prior art variable frequency oscillators, two phase-shifted signals are generated within a single loop of oscillation including an amplifier and a bandpass filter. A vector sum of the two signals is applied to the amplifier to generate oscillation. The input to the amplifier is controlled in phase by varying the amplitude of the two phase-shifted signals relative to the other. The prior art oscillators, however, have drawbacks in that possible nonuniformity in circuit parameters that determine the relative phase shifts of the two signals will result in an output frequency differing from the intended value and possible supply voltage fluctuations will cause the amplitude of the signals combined to drift indefinitely. Therefore, it is difficult to precisely maintain the output frequency at a constant value.

SUMMARY OF THE INVENTION

An object of the present invention is therefore to provide a variable frequency oscillator which comprises an oscillating loop having an amplifier, adder and a bandpass filter in cascade connection, and a variable angle phase shifter to shift the phase of a signal from any arbitrary point of the loop by a first or second phase angle depending on the polarities of a DC control voltage, the phase shifted signal being applied to the adder to provide vector summation of two signals.

Another object of the invention is to provide a variable frequency oscillator in which the frequency of the oscillating loop is tuned to a desired frequency when the DC control voltage is at zero volt.

According to the present invention, there is provided a variable frequency oscillator which comprises an oscillating loop including an amplifier, bandpass filter means and means having two inputs for providing vector summation of two signals applied thereto, all of which are connected in series such that the output of each is connected to an input of another; and means for providing shifting of the phase of an input signal applied thereto such that the phase shift is variable in accordance with a control signal applied thereto, said variable phase shifting means having an input connected to an arbitrary point of the oscillating loop and an output connected to the other input of the summation providing means.

Specifically, the variable phase shifting means comprises a 90° phase shifter and a double balanced differential amplifier. The signal from the oscillating loop is phase shifted by 90° and applied to the differential amplifier. A DC control voltage is applied to the differential amplifier such that the output signal is in phase with the 90° phase-shifted signal when the DC control voltage is negative and out of phase by 180° when the control voltage is positive, so that the output signal from the double balanced differential amplifier is a signal out of phase by 90° with respect to the signal in the oscillating loop or out of phase by 270° with respect to that signal. The amplitude of the signal is variable in accordance with the amplitude of the control voltage. The vector summation of the phase-shifted signal and the signal in the oscillating loop results in a signal of which the phase is controlled to vary its frequency.

To generate the control voltage a phase detector is provided having its first input connected to any point of the oscillating loop and its second input connected to receive a reference frequency for comparison in phase between the two signals, the amplitude and polarity of the output of the phase detector being dependent upon the relative phase of the two input signals.

BRIEF DESCRIPTION OF THE DRAWINGS

The invention will be clearly understood from the following description with reference to the accompanying drawings, in which:

FIG. 3 is a detailed circuit diagram of the embodiment of FIG. 1.

DESCRIPTION OF THE PREFERRED EMBODIMENT

Figure 1:
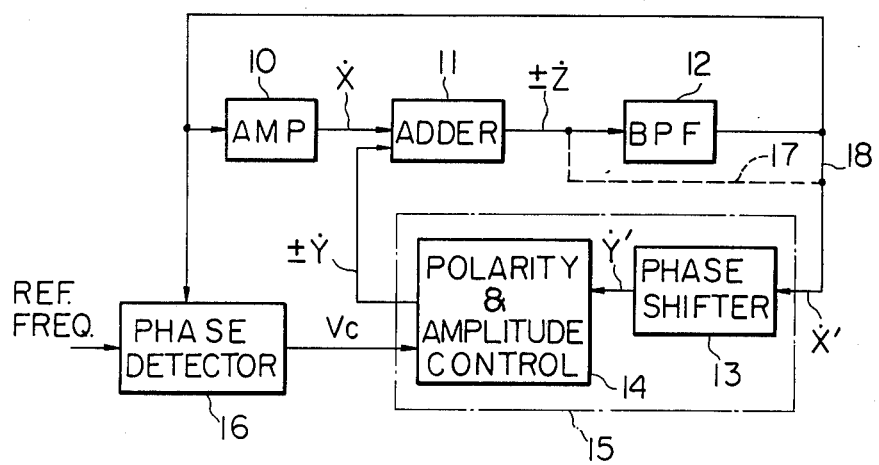
FIG. 1 is a circuit block diagram of an embodiment of the invention.
Figure 2:
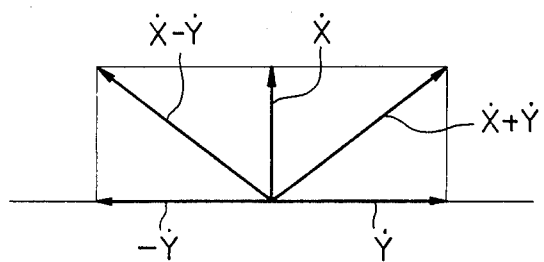
FIG. 2 is a vector diagram of signals appearing at various points of the circuit of FIG. 1.

Referring now to FIG. 1, an integrated circuit variable frequency oscillator embodying the present invention in a phase-locked loop is shown and comprises generally a free-running oscillating loop comprising an amplifier 10, an adder or vector summation circuit 11 and a bandpass filter or bandpass amplifier 12. A variable phase shifter 15 is provided having its signal input terminal connected to the output of bandpass amplifier 12 of the oscillating circuit and its output terminal connected to an input of the adder 11. The variable phase shifter 15 has a control input terminal connected to receive a DC voltage from a phase detector 16. Normally, free-running oscillation occurs in the regenerative loop substantially at the center frequency of the bandpass filter when the DC control voltage at the input to the variable phase shifter 15 is at zero potential. The variable phase shifter 15 includes a phase shifter 13 to impart a constant phase shift of 90°, for example, to the output $X'$ from the bandpass amplifier 12, and a polarity-and-amplitude controller 14 having its signal input terminal connected to the output $Y'$ of the phase shifter 13 and it output terminal connected to the adder 11. The controller 14 includes a control voltage terminal which receives the DC control voltage $V_c$ from the phase detector 16 to further impart a phase shift of 0° or 180° to the 90° phase-shifted signal depending on the polarity of the control voltage $V_c$, and to modulate the amplitude of the 90° or 270° phase-shifter signal in accordance with the control voltage $V_c$. As seen from FIG. 2, the output from the controller 14 is a signal $+Y$ which is phase-shifted by 90° with respect to the signal $X'$ from the bandpass fillter 12 or a signal $-Y$ which is phase-shifted by 270° with respect to the signal $X'$, and the amplitude of the signals $\pm Y$ is variable in dependence on the control voltage $V_c$. Since the output $X$ from amplifier 10 is in phase with the signal $X'$, the resultant vector summation of the signals $X$ and $\pm Y$ is delivered from the output of adder 11. Therefore, it is seen from FIG. 2 that since signal $X$ has a constant amplitude and signals $\pm Y$ vary in amplitude but $\pm 90°$ out of phase with the signal $X$, the signal in the oscillating loop is phased-shifted in the range as indicated by vectors $X \pm Y$. It is to be understood that when the oscillating circuit has stabilized to a new value of frequency, signals appearing at various points of the oscillating circuit are substantially in phase at a given instant of time so that the input to the variable phase shifter 15 may be obtained from any point of the oscillating loop as, for example, the output from the adder 11 as indicated by a broken-line connection 17, instead of connection 18 between the output of band-pass filter 12 and the input to the phase-shifter 13.

Referring to FIG. 3, details of the circuit of FIG. 1 are illustrated. The amplifier 10 comprises a pair of transistors T1 and T2 having their emitters connected through resistors R1 and R2 to a constant current source 20 and thence to ground and their base electrodes connected through resistors R3 and R4 to a base bias source $V_2$. The adder 11 comprises a resistor 21 having one of its terminals connected to a voltage supply $V_1$ through lead 22 and the other terminal connected to the collector of transistor T1 to serve as a load impedance for the transistor T1, the collector of transistor T2 being connected to the voltage supply $V_1$. The band-pass amplifier 12 includes a transistor T3 having its collector connected to the voltage supply $V_1$, its base connected to the junction between the load resistor 21 and the collector of transistor T1, and its emitter connected through resistor R5 to ground. The junction between the emitter of transistor T3 and resistor R5 is connected to a filter circuit consisting of an inductor L1 and a capacitor C1 which are connected in series to the base of transistor T2 of amplifier 10. Resistors R1 and R2 serve to regulate the loop gain of the oscillator. The voltage developed across the load impedance 21 is thus fed back to the input to the amplifier 10 through the bandpass amplifier 12 in a regenerative manner, and thus oscillation occurs at a frequency determined by the resonant frequency of the inductor L1 and capacitor C1. The oscillator output is phase shifted by 90° in phase shifter 13 including an inductor L2, capacitor C2 and a resistor R6 connected in parallel to the capacitor C2. The phase-shifted signal is applied to an input to the voltage control circuit 14 which comprises a first pair of transistors T4 and T5 having their emitters connected through resistors R7 and R8 to a constant current source 23 and thence to ground, and their base electrodes connected through resistors R9 and R10 to the bias voltage supply $V_2$. The control circuit 14 further includes a second pair of transistors T6 and T7 and a third pair of transistors T8 and T9. The emitters of transistors T6 and T7 are connected together to the collector of transistor T4 of the first pair. Similarly, the emitters of transistors T8 and T9 are connected together to the collector of transistor T5 of the first pair. The base electrodes of transistors T6 and T9 are connected together to a control input terminal 22a and the base electrodes of transistors T7 and T8 are connected together to the other input terminal 22b, so that when the terminal 22a is positive with respect to the terminal 22b transistors T6 and T9 will be biased on and the other transistors T7 and T8 biased off. The collectors of transistors T6 and T8 are connected together to the voltage supply $V_1$ and the collectors of transistors T7 and T9 are connected together to the load resistor 21. The base of transistor T5 serves as the input terminal to receive the 90° phase-shifted signal from the phase shifter 13.

The transistors T4 to T9 of the phase control circuit 14 constitute a double-balanced differential amplifier. When the voltage Vc across the control voltage terminals 22a and 22b is at zero volt, transistors T6 to T9 are under equilibrium condition. Under the equilibrium condition, the current drawn by transistors T9 and T5 and the current drawn by transistors T7 and T4 are equal in amplitude, but opposite in polarity. Therefore, no signal will appear at the common collectors of transistors T7 and T9. When terminal 22a is positive with respect to terminal 22b, transistors T7 and T8 are biased off, while transistors T6 and T9 are biased forwardly to conduct current which develops a signal at the collector of transistor T9, which signal is out of phase by 180° with respect to the base input of transistor T5 and proportional in amplitude to the voltage $V_c$. When the polarity of voltage $V_c$ is reversed, transistors T6 and T9 are biased off, while transistors T7 and T8 are biased forwardly to conduct current which causes a signal to appear at the collector of transistor T7, which signal is in phase with the base input of transistor T5 and proportional in amplitude to the voltage $V_c$.

By controlling the amplitude and polarity of the control voltage $V_c$, the output signal from the control circuit 14 is caused to advance or lag by 90° with respect to the output X' from the bandpass amplifier 12. Since the resistor 21 serves as a common load for the outputs from the circuits 10 and 14, the signal applied to the base of transistor T3 of the bandpass amplifier 12 is a vector sum of the two outputs as previously described with reference to FIG. 2.

The phase detector 16 has one of two input terminals connected to the output from the bandpass filter 12, or any point in the oscillating loop and the other input terminal connected to receive a reference frequency. The reference frequency may be a color burst signal transmitted from a television station. The phase detector 16 provides automatic frequency and phase control (AFPC) by generating zero DC potential when there is no phase difference between the two frequencies and generates a positive or negative DC voltage depending on the relative phases of the two frequencies. When the control voltage $V_c$ is at zero potential, the variable phase shifter 15 delivers no output and the oscillating loop is controlled at the reference frequency. Therefore, any deviation of a supply voltage will not cause the oscillator frequency to drift from the reference frequency.

What is claimed is:

1. A variable frequency oscillator comprising:
   an oscillating loop including an amplifier, bandpass filter means having a passband response characteristic with the center frequency substantially equal to a free-running frequency of said oscillating loop and means having two inputs for providing vector summation of two signals applied thereto, all of which are connected in series such that the output of each is connected to an input of another; and
   means for shifting the phase of an input signal applied thereto such that the phase shift is variable in correspondence to a control signal applied thereto, said variable phase shifting means having an input connected to an arbitrary point of said oscillating loop and an output connected to the other input of said summation providing means.

2. A variable frequency oscillator as claimed in claim 1, wherein said variable phase shifting means provides an output signal of which the phase is displaced from the phase of an input signal applied thereto by a first or a second phase angle depending on the polarities of said control signal and the amplitude is modulated with the amplitude of said control signal, said first and second phase angles being spaced apart by 180°.

3. A variable frequency oscillator as claimed in claim 2, wherein said first phase angle is 90°.

4. A variable frequency oscillator as claimed in claim 2, wherein said variable phase shifting means comprises a phase shifter for imparting a phase shift of 90° to the signal from the arbitrary point of said oscillating loop, and means connected to the output of said phase shifter to control the amplitude and polarity of said phase shifted signal with the amplitude and polarity of said control signal.

5. A variable frequency oscillator as claimed in claim 4, wherein said amplitude and polarity control means comprises a double-balanced differential amplifier.

6. A variable frequency oscillator as claimed in claim 5, wherein said vector summation providing means comprises a load impedance connected between a voltage supply and the output of said double-balanced differential amplifier.

7. A variable frequency oscillator as claimed in claim 6, wherein said double-balanced differential amplifier comprises:

a first pair of transistors having their emitters connected together through respective resistors to a constant current source and thence to ground and having their base electrodes connected together through respective resistors to a bias voltage supply; and a second pair of transistors having their emitters connected together to the collector of a first transistor in said first pair;

a third pair of transistors having their emitters connected together to the collector of a second transistor in said first pair, the base electrode of a first transistor in the second pair and a second transistor in the third pair being connected together to one of two input terminals, and the base electrodes of a second transistor in the second pair and a first transistor in the third pair being connected together to the other input terminal, the collectors of the first transistors in the second and third pairs being connected together to said voltage supply and the collectors of the second transistors in the second and third pairs being connected together to the load impedance.

8. A variable frequency oscillator as claimed in claim 7, wherein the amplifier of said oscillating loop has its output connected to the said load impedance.

9. A variable frequency oscillator as claimed in claim 8, wherein the amplifier of said oscillating loop comprises a pair of first and second transistors having their emitters connected through a respective resistor to a constant current source and thence to ground and their base electrodes connected through a respective resistor to a bias voltage supply, the collector of the first transistor being connected to one terminal of the load impedance and the collector of the second transistor being connected to the terminal of the load impedance to which said voltage supply is connected.

* * * * *